United States Patent
Kim et al.

(10) Patent No.: US 8,275,427 B2
(45) Date of Patent: Sep. 25, 2012

(54) MAGNETOELECTRIC SUSCEPTIBILITY MEASUREMENT METHOD AND THE SYSTEM THEREOF

(75) Inventors: Kee hoon Kim, Seoul (KR); Yoon seok Oh, Gunpo (KR)

(73) Assignee: Seoul National University Industry Foundation, Seoul (KR)

( * ) Notice: Subject to any disclaimer, the term of this patent is extended or adjusted under 35 U.S.C. 154(b) by 503 days.

(21) Appl. No.: 12/441,380

(22) PCT Filed: Oct. 5, 2007

(86) PCT No.: PCT/KR2007/004860
§ 371 (c)(1),
(2), (4) Date: Mar. 13, 2009

(87) PCT Pub. No.: WO2008/069423
PCT Pub. Date: Jun. 12, 2008

(65) Prior Publication Data
US 2009/0270262 A1    Oct. 29, 2009

(30) Foreign Application Priority Data

Dec. 7, 2006   (KR) .................. 10-2006-0123845

(51) Int. Cl.
*G01R 33/035* (2006.01)
(52) U.S. Cl. .................. 505/160; 505/845; 324/201
(58) Field of Classification Search ............... 505/160, 505/705, 843–845; 324/201
See application file for complete search history.

(56) References Cited

U.S. PATENT DOCUMENTS

| | | | | |
|---|---|---|---|---|
| 5,311,125 A | * | 5/1994 | Krause et al. ................. | 324/201 |
| 5,506,500 A | * | 4/1996 | Krause et al. ................. | 324/201 |
| 7,405,555 B2 | * | 7/2008 | Rao et al. ..................... | 324/201 |
| 2011/0140688 A1 | * | 6/2011 | Yang ............................. | 324/201 |

FOREIGN PATENT DOCUMENTS

| | | |
|---|---|---|
| JP | 03-095474 A | 4/1991 |
| JP | 09-119873 A | 5/1997 |
| JP | 2003-207553 A | 7/2003 |
| KR | 1020010083570 A | 9/2001 |
| KR | 1020040102467 A | 12/2004 |
| KR | 1020050098136 A | 10/2005 |
| KR | 1020050121389 A | 12/2005 |

OTHER PUBLICATIONS

Milov et al "An Instillation for studying the magnetoelectric effect", Instruments and Experimental Tech, 43(4) 2000, 556-559.*
T. H. O'Dell, "Pulse Measurements of the Magnetoelectric Effect in Chromium Oxide," IEEE Transactions on Magnetics, Sep. 1966, pp. 449-452, vol. 2, No. 3.
International Search Report for application PCT/KR2007/004860 filed Oct. 5, 2007, (mailed Jan. 11, 2008).

* cited by examiner

*Primary Examiner* — Mark Kopec

(57) ABSTRACT

Disclosed herein is a method and system for measuring magnetoelectric susceptibility. The system includes a magnet supplying a DC magnetic bias to a magnetoelectric sample, an AC drive coil applying an AC magnetic field to the magnetoelectric sample, a charge amplifier amplifying an electric charge signal of the magnetoelectric sample oscillating by the AC magnetic field, and a phase sensitive detector detecting the voltage signal produced by the charge amplifier while supplying induction current to the AC drive coil. Accordingly, it is possible to provide a highly sensitive system for measuring magnetoelectric susceptibility, which is essential for research on multiferroic and magnetoelectric bulk and thin film materials at room temperature, and can also operate in the physical property measurement system (PPMS, manufactured by Quantum Design Co., Ltd.) for measurements under low temperature and high magnetic field environments.

19 Claims, 5 Drawing Sheets

MAGNETOELECTRIC SUSCEPTIBILITY MEASUREMENT METHOD AND THE SYSTEM THEREOF

TECHNICAL FIELD

The present invention relates to a magnetoelectric susceptibility measurement method and a system thereof, and more particularly to a method and system for measuring magnetoelectric susceptibility with high measurement sensitivity.

BACKGROUND ART

Magnetoelectric effect refers to a phenomenon observed in materials that interact with both electric fields and magnetic fields, whereby an electric field applied to such a material can induce magnetization and an external magnetic field applied thereto can induce electric polarization of the material. Accordingly, when a material exhibits the magnetoelectric effect, the material generally has both magnetic field related properties, such as ferromagnetism, ferrimagnetism or antiferromagnetism, and electric field related properties, such as ferroelectricity, ferrielectricity or antiferroelectricity.

For commercial success of magnetoelectric sensors, magnetic sensors, electric sensors, photoelectron devices, microwave electric devices, and magnetoelectric or electromagnetic transducers, which have been and continue to be researched, it is essential to develop materials which have both ferromagnetic and ferroelectric properties at room temperature, i.e. 25° C., and exhibit magnetoelectric effect at room temperature or higher temperatures where devices are actually used. Accordingly, for fundamental understanding of the magnetoelectric effect, studies on properties of magnetoelectric materials at room temperature and very low temperature have been conducted worldwide.

Such studies and applications require equipment to measure the magnetoelectric effect of such materials. Such equipment has not been commercialized but has been manufactured and used for laboratory research. Recently, in addition to the studies on the properties of magnetoelectric materials, aixACCT Systems, a leading manufacturer of measurement equipment for ferroelectric properties, is attempting to develop technologies incorporating measurement option for magnetoelectric properties into their popular equipment for measuring ferroelectric properties.

Most traditional equipment for measuring the magnetoelectric effect employs a method of measuring voltage generated from variations in electric dipoles due to a varying magnetic field. Accuracy of such equipment depends upon the thickness of a target material, thus lowering sensitivity in the measurements of a thin-film material exhibiting the magnetoelectric effect. Furthermore, the conventional method yields poor measurement accuracy and is not appropriate for measurement in a low-frequency band.

DISCLOSURE

Technical Problem

It is an aspect of the present invention to provide a method and system for measuring magnetoelectric susceptibility with high measurement sensitivity.

It is another aspect of the present invention to a system for measuring magnetoelectric susceptibility both at low-frequency and high-frequency bands.

It is a further aspect of the present invention to a system for measuring magnetoelectric susceptibility in cryogenic and high magnetic field environments.

Technical Solution

In accordance with an aspect of the present invention, the above and other features of the present invention can be accomplished by the provision of a method for measuring magnetoelectric susceptibility of a sample by applying an alternating current (AC) magnetic field to the sample, amplifying an electric charge signal of the sample oscillating by the AC magnetic field, and detecting the amplified the electric charge signal, wherein the amplified electric charge signal is converted to a voltage signal and the converted voltage signal is detected. In more detail, the method for measuring magnetoelectric susceptibility of a sample includes: applying a direct current (DC) magnetic bias to the sample; applying an AC magnetic field having a predetermined frequency to the sample; amplifying an electric charge of the sample oscillating by the AC magnetic field and converting the amplified electric charge to a voltage signal; and detecting the amplified voltage signal.

In accordance with another aspect of the present invention, a system for measuring magnetoelectric susceptibility includes: a device supplying a DC magnetic bias to a magnetoelectric sample; an AC drive coil applying an AC magnetic field to the magnetoelectric sample; a charge amplifier amplifying an electric charge signal of the magnetoelectric sample oscillating by the AC magnetic field; and a phase sensitive detector detecting the voltage signal amplified by the charge amplifier while supplying a drive current to the AC drive coil. The charge amplifier may include a resistor, a capacitor, and an operational amplifier, which are connected in parallel. The device may comprise one of an electromagnet and a superconducting magnet. The AC drive coil may be a Helmholtz coil or a solenoid coil.

In accordance with a further aspect of the present invention, a system for measuring magnetoelectric susceptibility includes: a solenoidal AC drive coil applying an AC magnetic field to a magnetoelectric sample; and a fine-detection coil disposed inside the AC drive coil and detecting a magnetic signal of the AC magnetic field. The system may further include an electrical shield configured to electrically shield the magnetoelectric sample and the fine-detection coil from the AC drive coil. The system may further include an AC compensation coil compensating an outside component of the AC magnetic field of the AC drive coil. The AC compensation coil may be a solenoid coil. The AC compensation coil may be wound in a direction opposite to a direction of the AC drive coil. The AC compensation coil may be electrically connected directly to the AC drive coil. The system may further include a phase sensitive detector for detecting a signal of the fine-detection coil. The electrical shield may comprise one selected from the group consisting of stainless steel, aluminum, copper, and oxygen-free high conductivity (OFHC) copper. Copper and oxygen-free high conductivity copper may be plated with gold to prevent oxidation. The magnetoelectric sample and the charge amplifier may be connected to each other by a micro coaxial cable. The device supplying the DC magnetic bias to the magnetoelectric sample may comprise the physical property measurement system (PPMS, Quantum Design) including a superconducting magnet and a cryostat.

Advantageous Effects

According to the present invention, the magnetoelectric susceptibility measurement system including a charge amplifier can measure magnetoelectric effect of magnetoelectric materials with high measurement sensitivity. Accordingly, it is possible to provide a magnetoelectric susceptibility measurement system with improved measurement sensitivity.

In addition, the magnetoelectric susceptibility measurement system including a charge amplifier can measure magnetoelectric effect of magnetoelectric materials both at low- and high-frequency bands. Accordingly, it is possible to provide a magnetoelectric susceptibility measurement system which can be used in a wider frequency range.

Furthermore, the magnetoelectric susceptibility measurement system including a charge amplifier can measure magnetoelectric effect of magnetoelectric materials in cryogenic (down to 1.8K) and high-intensity magnetic field (up to 45 T) environments. Accordingly, it is possible to provide a magnetoelectric susceptibility measurement system which allows researches on the new materials exhibiting the magnetoelectric effect.

DESCRIPTION OF REFERENCE NUMERALS FOR THE DRAWINGS

Figure 1:
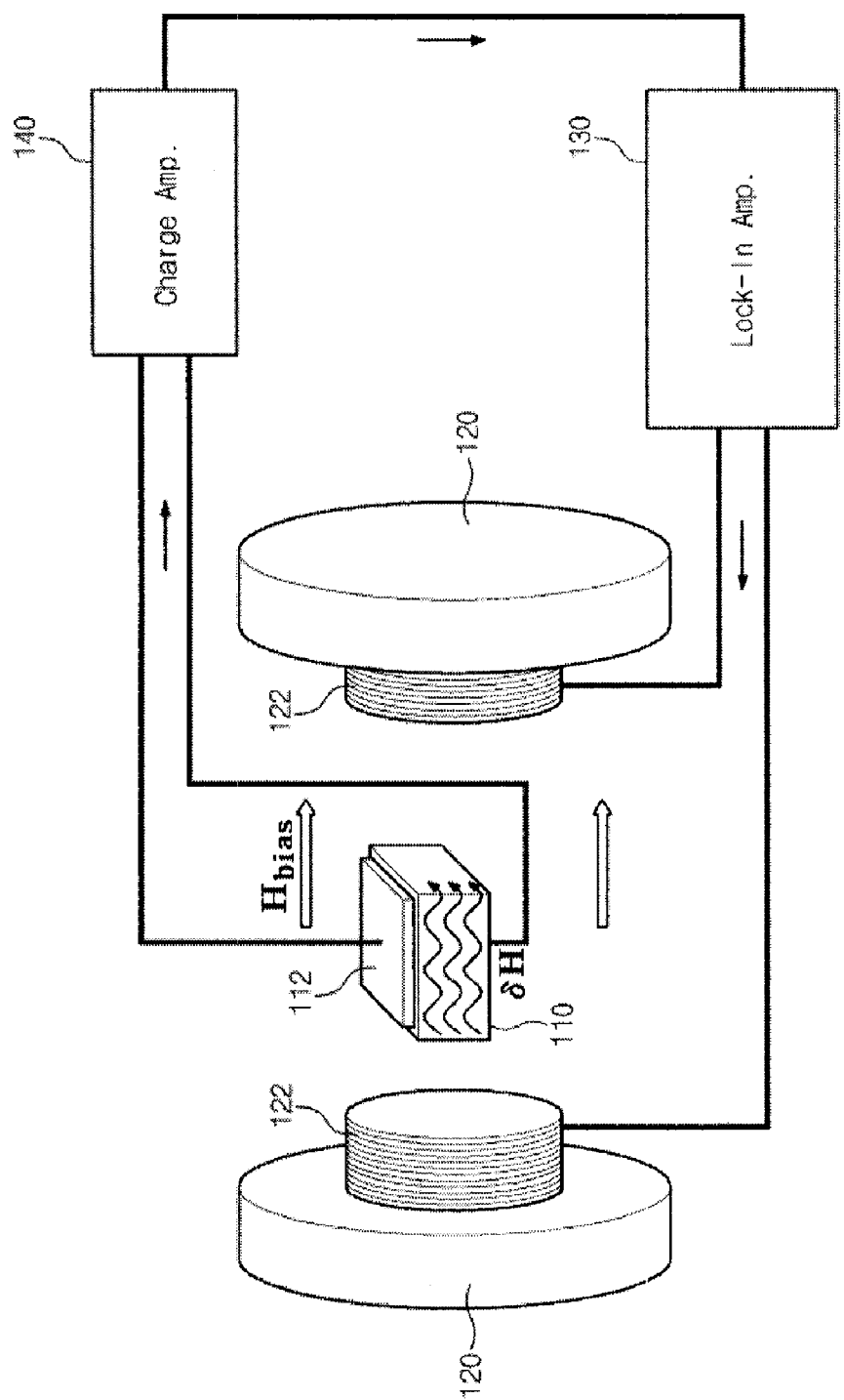
FIG. 1 shows a schematic diagram of a system for measuring magnetoelectric susceptibility according to an exemplary embodiment of the present invention.

110: magnetoelectric sample
210s: sample area
122: Helmholtz coil
222b: AC compensation coil
130, 230, 330: lock-in amplifier
140, 240, 340: charge amplifier
144: resistor
245: electrical shield
350: transport puck
112: electrode
120: magnet
222a: AC drive coil 222a
224: fine-detection coil
235: lock-in amplifier
142: capacitor
146: operational amplifier
300: AC solenoid coil set

BEST MODE

Exemplary embodiments of the present invention will be described in detail with reference to the accompanying drawings. The present invention may, however, be embodied in many different forms and should not be construed as limited to the exemplary embodiments set forth herein. Rather, these exemplary embodiments are provided so that this disclosure is thorough and sufficient description of the present invention, and will fully convey the spirit of the invention to those skilled in the art. In the drawings, the size and relative sizes of layers and regions may be exaggerated for clarity. It should be noted that reference numerals given in sequence of the description are not limited to the sequence and like reference numerals in the drawings denote like elements.

A magnetoelectric material may satisfy the following Equation 1:

$$\vec{P} = \overleftrightarrow{\chi}\vec{E} + \overleftrightarrow{\alpha}\vec{H} \xrightarrow{\vec{E}=0} \vec{P} = \overleftrightarrow{\alpha}\vec{H} \qquad <\text{Equation 1}>$$

Here, the term P denotes electric polarization of a material. That is, Equation 1 indicates that electric polarization P of the material is produced by applying electric field E or magnetic field H. The coefficients $\chi$ and $\alpha$ represent susceptibility for electric field E and magnetic field H, respectively. The coefficient $\chi$ denotes permittivity of a ferroelectric material, and the coefficient $\alpha$ denotes magnetoelectric susceptibility. In such a magnetoelectric material, if E=0, the electric polarization P is expressed as follows:

$$\vec{P} = \overleftrightarrow{\alpha}\vec{H} = \overleftrightarrow{\alpha}(H)\vec{H} = \begin{pmatrix} P_x \\ P_y \\ P_z \end{pmatrix} \begin{pmatrix} \alpha_{xx} & \alpha_{xy} & \alpha_{xz} \\ \alpha_{yx} & \alpha_{yy} & \alpha_{yz} \\ \alpha_{zx} & \alpha_{zy} & \alpha_{zz} \end{pmatrix} \begin{pmatrix} H_x \\ H_y \\ H_z \end{pmatrix}$$

In this case, a directional single crystal may have different electric polarizations in x-, y- and z-directions. Accordingly, a magnetic field may be applied in x-, y- and z-directions. Therefore, the magnetoelectric susceptibility becomes a three-dimensional tensor in x-, y- and z-directions.

Equation 1 is an equation expressing electric polarization of a magnetoelectric material induced by a magnetic field while an electric field is not applied to the magnetoelectric material.

In this case, the magnetic field is applied in one of x-axis, y-axis and z-axis directions. For example, a magnetic field applied only along the z-axis of a sample may be expressed by the following Equation 2:

$$\vec{H} = \begin{pmatrix} H_x \\ H_y \\ H_z \end{pmatrix} = \begin{pmatrix} 0 \\ 0 \\ H_z \end{pmatrix}, \qquad <\text{Equation 2}>$$

If the assumption of Equation 2 is applied to Equation 1, the polarization of the sample in x-axis, y-axis and z-axis directions depends upon the magnetic field as expressed by the following Equation 3:

$$\begin{pmatrix} P_x \\ P_y \\ P_z \end{pmatrix} = \begin{pmatrix} \alpha_{xz}(H)H_z \\ \alpha_{yz}(H)H_z \\ \alpha_{zz}(H)H_z \end{pmatrix}. \qquad <\text{Equation 3}>$$

In this case, the polarization of one of three axes of x, y and z is expressed by the following Equation 4:

$$P_j = \alpha_{jz}(H_z)H_z \qquad <\text{Equation 4}>$$

$\alpha_{jz}$ of Equation 4 also depends upon the magnetic field, which is expressed as the following equation 5:

$$\alpha_{jz}(H_z) = \alpha_{jz}^{(0)} + \alpha_{jz}^{(1)} H_z + \alpha_{jz}^{(2)} H_z^2 + \ldots \qquad \text{<Equation 5>}$$

Accordingly, Equation 4 may also be expressed as the following equation 6.

That is, polarization $P_j$ of a certain j-direction in x-axis, y-axis, and z-axis is expressed by the following. Equation 6, which is a polynomial for magnetic field $H_z$ along the z-axis:

$$P_j = \alpha_{jz}(H_z) H_z = \alpha_{jz}^{(0)} H_z + \alpha_{jz}^{(1)} H_z^2 + \alpha_{jz}^{(2)} H_z^3 + \ldots \qquad \text{<Equation 6>}$$

where $\alpha_{jz}^{(0)}$, $\alpha_{jz}^{(1)}$, $\alpha_{jz}^{(2)}$ are coefficients of each term, which are constants.

The magnetic field along the z-axis is applied by $\delta H_z$ as expressed in the following Equation 7, which is composed of a DC magnetic bias $H_{z,bias}$ and an AC magnetic field having a frequency of $\omega$ $$H_z = H_{Z,BIAS} + H_Z \sin wt \qquad \text{<Equation 7>}$$

The polarization of a material within such an external magnetic field is expressed by Equation 8:

$$P_j = \alpha^{(0)}_{jz}(H_{Z,BIAS} + H_Z \sin wt) + \alpha^{(1)}_{jz}(H_{Z,BIAS} + H_Z \sin wt) + \alpha^{(2)}_{jz}(H_{Z,BIAS} + H_Z \sin wt) \qquad \text{<Equation 8>}$$

In this case, polarization $\delta P_j$ oscillating with a frequency of $\omega$ can be detected using a phase sensitive detector, and is expressed by the following Equation 9. The polarization $\delta P$ of a sample is equal to the amount of charge $\delta Q$ per unit area of a sample electrode. That is, assuming that the electrode has an area of A, the polarization $\delta P$ and the amount of charge, $\delta Q$, are expressed as $\delta P = \delta Q/A$, and the amount of charge, $\delta Q$, is input to the charge amplifier in actual measurement.

$$\delta P_j \sin wt = (\alpha_{jz}^{(0)} + 2\alpha^{(1)}_{jz} H_{Z,BIAS} + 3\alpha^{(2)}_{jz} H_{Z,BIAS}^2 + \ldots) \delta H_Z \sin wt \qquad \text{<Equation 9>}$$

Therefore, magnetoelectric susceptibility $\alpha_{jz}$ is expressed by the following equation 10:

$$\alpha_{jz} = \delta P_j / \delta H_z = \alpha_{jz}^{(0)} + 2\alpha^{(1)}_{jz} H_{Z,BIAS} + 3\alpha^{(2)}_{jz} H_{Z,BIAS}^2 + \ldots \quad \text{<Equation 10>}$$

As a result, if a magnetic field is applied to a magnetoelectric material along the z-axis, magnetic susceptibilities along the x-axis, y-axis and z-axis of the magnetoelectric material may be expressed by the following Equation 11:

$$\alpha_{13} = \alpha_{xz} = \delta P_x / \delta H_z = \alpha_{xz}^{(0)} + 2\alpha^{(1)}_{xz} H_{Z,BIAS} + 3\alpha^{(2)}_{xz} H_{Z,BIAS}^2 + \ldots$$

$$\alpha_{23} = \alpha_{yz} = \delta P_y / \delta H_z = \alpha_{yz}^{(0)} + 2\alpha^{(1)}_{yz} H_{Z,BIAS} + 3\alpha^{(2)}_{yz} H_{Z,BIAS}^2 + \ldots$$

$$\alpha_{33} = \alpha_{zz} = \delta P_z / \delta H_z = \alpha_{zz}^{(0)} + 2\alpha^{(1)}_{zz} H_{Z,BIAS} + 3\alpha^{(2)}_{zz} H_{Z,BIAS}^2 + \ldots \qquad \text{<Equation 11>}$$

From Equation 11, it is possible to understand the properties of the magnetoelectric material.

Therefore, according to an exemplary embodiment of the present invention, magnetoelectric susceptibility is measured by applying an AC magnetic field to a magnetoelectric sample, amplifying an electric charge signal of the sample oscillating with the magnetic field, and detecting the amplified charge signal. The charge signal may be converted into a voltage signal and then detected. In this manner, it is possible to design a system for measuring magnetoelectric susceptibility.

FIG. 1 is a schematic diagram of a system for measuring magnetoelectric susceptibility according to an exemplary embodiment of the present invention.

The magnetoelectric susceptibility measurement system for room temperature measurement includes a magnet 120, a Helmholtz coil 122, a charge amplifier 140, and a lock-in amplifier 130.

The magnet 120 applies DC magnetic bias $H_{z,bias}$ to a magnetoelectric sample 110. The magnet 120 is preferably an electromagnet.

The Helmholtz coil 122 applies AC magnetic field $\delta H_Z$ ($B_{ac}$, $\delta H$), having a frequency of $\omega$ to the magnetoelectric sample 110 by induced current $I_0 e^{iwt}$ ($I_0 \sin \omega t$) having a frequency of $\omega$ supplied from the lock-in amplifier 130. The Helmholtz coil 122 may apply a uniform magnetic field to a wide area.

The magnetoelectric sample 110 may be composed of a substrate (not shown), which is used as a lower electrode, and a magnetoelectric material, which is formed on the substrate. An upper electrode 112 may be further formed on the magnetoelectric sample 110. The substrate used as a lower electrode may be made of $SrTiO_3$ (STO) doped with niobium (Nb). The upper electrode 112 may be made of gold (Au).

The charge amplifier 140 amplifies a charge signal $\delta Q$ of the magnetoelectric sample 110 oscillating by an AC magnetic field ($B_{ac}$) having a frequency of $\omega$ which is produced by the Helmholtz coil 122, and converts the amplified charge signal to a voltage signal ($\delta V$).

The lock-in amplifier 130 is used as a Phase Sensitive Detector (PSD) to detect the voltage signal 6V which is output from the charge amplifier 140. Accordingly, it is possible to measure the charge signal $\delta Q$ of the magnetoelectric sample 110 oscillating by the AC magnetic field $B_{ac}$ having a frequency $\omega$ which is produced from the Helmholtz coil 122 by the induced current ($I_0 \sin \omega t$) having a frequency $\omega$ which is supplied from the lock-in amplifier 130.

As a result, unlike a conventional system for measuring voltage which is produced by a variation in an electric dipole generated in the magnetoelectric sample 110, the magnetoelectric susceptibility measurement system according to an exemplary embodiment of the present invention amplifies electric charges of the magnetoelectric sample 110 oscillating by AC magnetic field and measures the amplified electric charges, thereby substantially improving measurement sensitivity with respect to the magnetoelectric effect.

Figure 2:
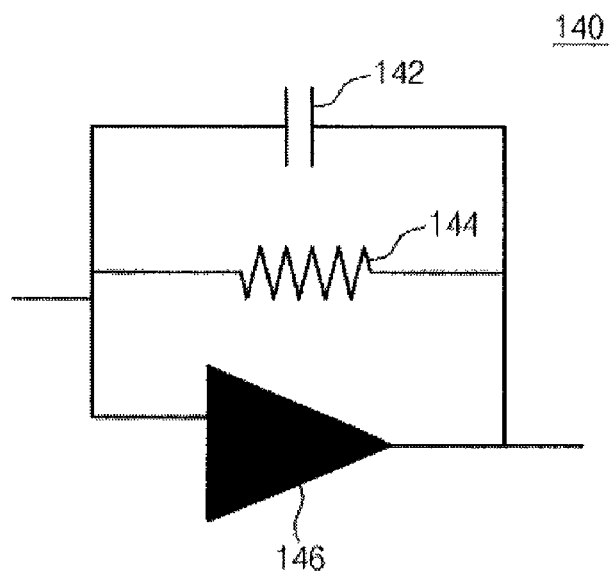
FIG. 2 is a circuit diagram of a charge amplifier shown in FIG. 1.

FIG. 2 is a circuit diagram of the charge amplifier shown in FIG. 1.

Referring to FIG. 2, the charge amplifier 140 includes a resistor 144, a capacitor 142, and an operational amplifier (OP amp) 146, which are connected in parallel. The charge amplifier 140 may be an integral circuit.

The resistor 144 may have a resistance in the range of 100 Ωohm) to 1 GΩ gigaohm), and preferably from 0.1 to 1 GΩ. The capacitor may have a capacitance in the range of 1 μF to 1 pF, and preferably from 0.1 μF to 1 pF. The resistor 144 and the capacitor 142 determine a time constant of a resistor-capacitor circuit. The magnetoelectric susceptibility measurement system according to an exemplary embodiment of the present invention can obtain a gain in a low-frequency band using the resistor having a resistance of the above-mentioned range. The OP amp 146 converts an amplified charge signal to a voltage signal.

Figure 3:
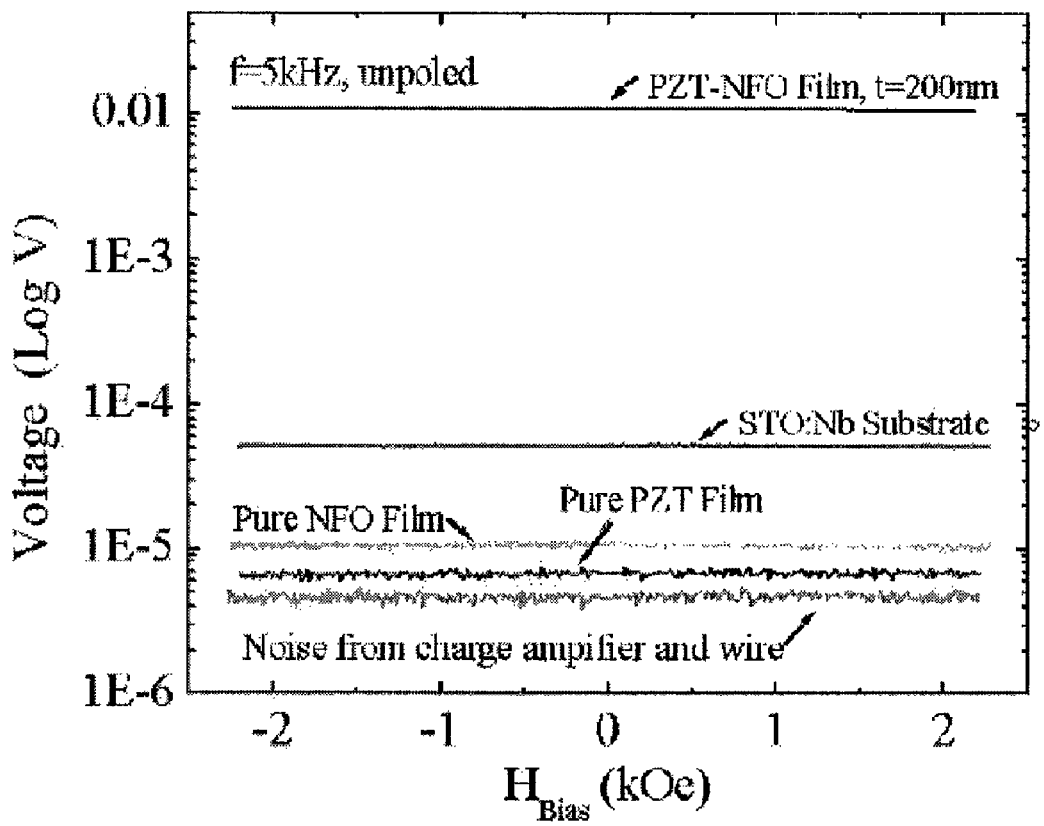
FIG. 3 is a graph of a background signal of a system for measuring magnetoelectric susceptibility according to an exemplary embodiment of the present invention.

FIG. 3 is a graph of a background signal measured in a magnetoelectric susceptibility measurement system according to an exemplary embodiment of the present invention.

Referring to FIG. 3, the graph shows background values measured with respect to a plurality of materials including a no-sample condition while applying DC magnetic bias and AC magnetic field to the magnetoelectric susceptibility measurement system. The magnetoelectric susceptibility measurement system measures background values of $5\times10^{-6}$ V, $7\times10^{-6}$ V, $1\times10^{-5}$ V, $5\times10^{-5}$ V and 0.01 V with respect to pure $Pb_{0.52}Zr_{0.48}TiO_3$ (PZT), pure $NiFe_2O_4$ (NFO), an $SrTiO_3$ (STO) substrate doped with niobium (Nb), and PZT-NFO, respectively. It can be seen from FIG. 3 that PZT-NFO has a larger background value than any signal which can be generated as a noise in a measurement operation.

Figure 4:
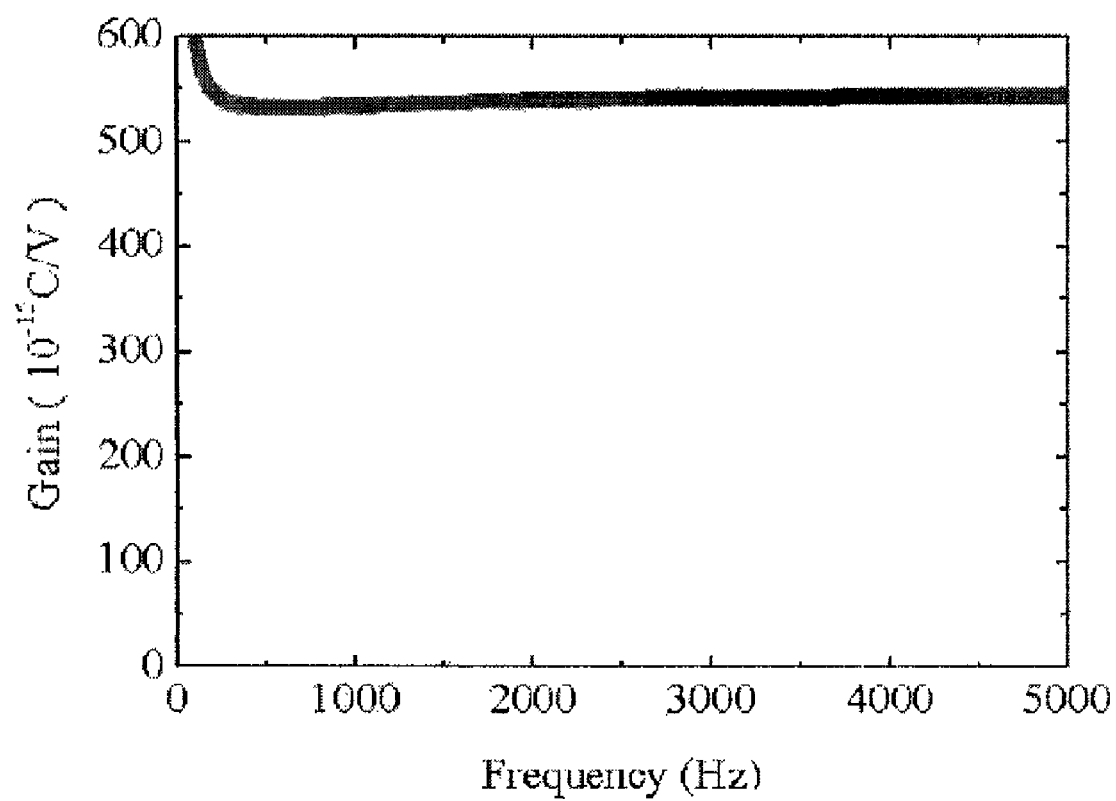
FIG. 4 is a graph of a gain of a system for measuring magnetoelectric susceptibility according to an exemplary embodiment of the present invention.

FIG. 4 is a graph of gains of a magnetoelectric susceptibility measurement system according to an exemplary embodiment of the present invention.

Referring to FIG. 4, the graph shows a characteristic curve indicating gains of a charge amplifier measured while changing frequencies of AC magnetic field applied to the magnetoelectric susceptibility measurement system. As shown in the characteristic curve, the magnetoelectric susceptibility measurement system shows gains in the range of $530\times10^{-15}$ to $550\times10^{-15}$ C/V at a wide low-frequency band (5,000 Hz and below). This is because the charge amplifier 140 uses a resistor having, for example, a resistance of 1 GΩ.

As can be seen from FIGS. 3 and 4, the magnetoelectric susceptibility measurement system uses the charge amplifier to measure electric charges of a magnetoelectric material oscillating by an AC magnetic field. Accordingly, the system can measure an oscillation of a charge as small as about $10^{-17}$ C, thereby substantially improving measurement sensitivity of the magnetoelectric effect.

Figure 5:
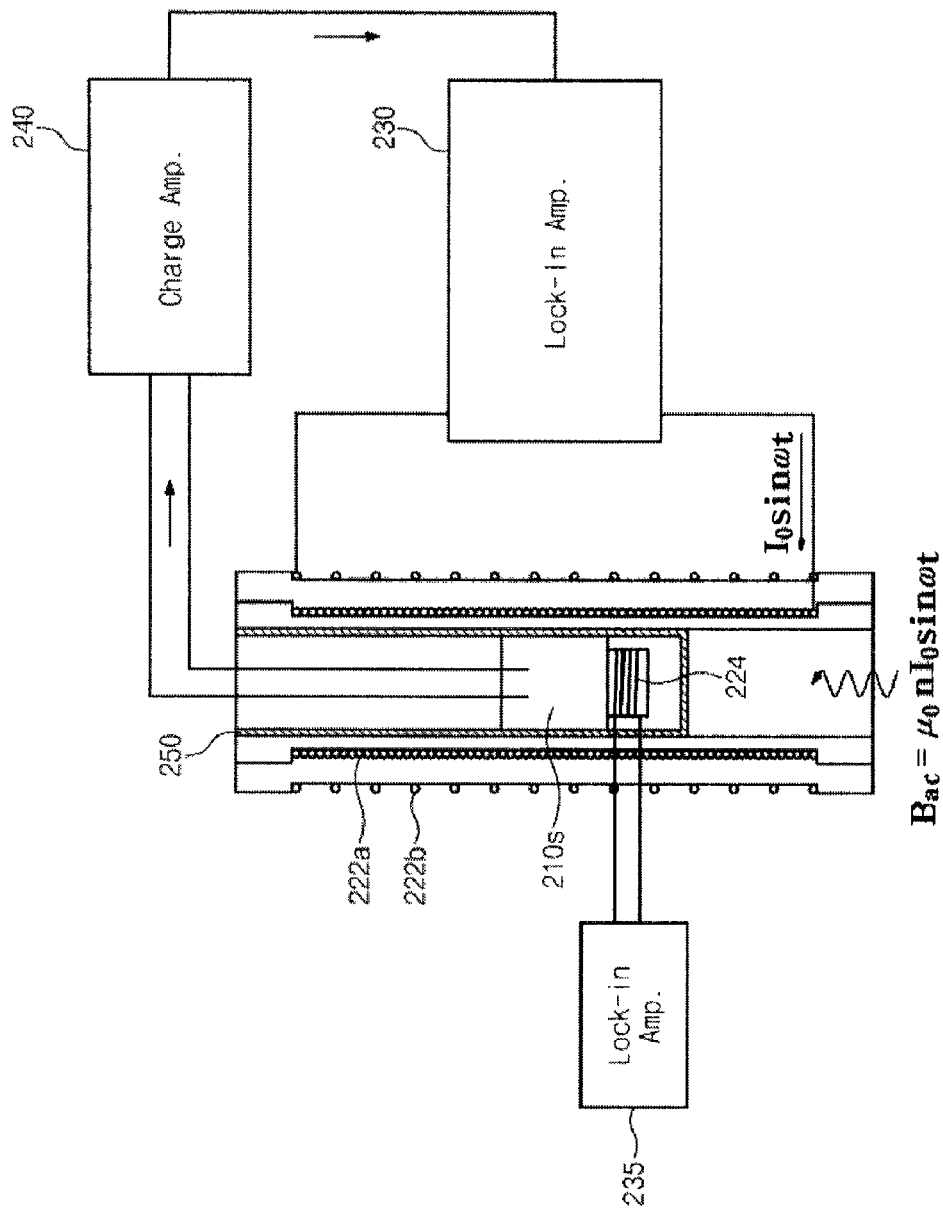
FIG. 5 is a schematic diagram of a system for measuring magnetoelectric susceptibility according to an exemplary embodiment of the present invention.

FIG. 5 is a schematic diagram of a magnetoelectric susceptibility measurement system according to an exemplary embodiment of the present invention.

Referring to FIG. 5, the low-temperature magnetoelectric susceptibility measurement system includes an AC drive coil 222a, a fine-detection coil 224, an electrical shield 250, a charge amplifier 240, and a lock-in amplifier 230.

The low-temperature magnetoelectric susceptibility measurement system may further include an external device (not shown) which supplies DC magnetic bias $H_{z,bias}$ to a magnetoelectric sample (not shown). The external device may be a typical Physical Property Measurement System (PPMS) which is a combination of a superconducting magnet and a cryostat. The superconducting magnet and the cryostat may provide a DC magnetic bias and a cryogenic ambient temperature to 2 K, respectively, to the magnetoelectric sample.

The AC drive coil 222a may apply all AC magnetic field ($B_{ac}$, $_0nI_0 \sin \omega t$) having a frequency ω to a magnetoelectric sample (not shown) by induced current ($I_0 \sin \omega t$) having a frequency of ω supplied from the lock-in amplifier 230. The AC drive coil 222a may be a solenoid. The AC drive coil 222a may be wound around a tube, such as acryl, epoxy, bakelite, wood or aluminum, which is dielectric and nonmagnetic. The solenoidal AC drive coil 222a may supply a high-intensity magnetic field (~9T) to a narrow space.

The low-temperature magnetoelectric susceptibility measurement system may further include an AC compensation coil 222b to compensate an outside component of the AC magnetic field ($B_{ac}$) produced from the AC drive coil 222a. The AC compensation coil 222b may be a solenoid. The AC detection coil 222b may be wound around a tube, such as acryl, epoxy, bakelite, wood or aluminum, which is dielectric and nonmagnetic. The AC detection coil 222b may be wound in an opposite direction to that of the AC drive coil 222a. Accordingly, the outside component of the AC magnetic field ($B_{ac}$) produced from the AC drive coil 222a may be compensated by the AC compensation coil 222b. This can be expressed by the following Equation factoring in the turns n1 and cross section $A_1$ of the AC drive coil 222a and the turns $n_2$ and cross section $A_2$ of the AC compensation coil 222b. The AC compensation coil 222b may be electrically connected to the AC drive coil 222a. Preferably, the AC compensation coil 222b and the AC drive coil 222a are formed together as a single line.

$$n_1 A_1 = n_2 A_2 \qquad \text{<Equation>}$$

The fine-detection coil 224 is located inside the AC drive coil 222a, and detects oscillation of the AC magnetic field ($B_{ac}$) having a frequency of ω produced from the AC drive coil 222a. Since the fine-detection coil 224 detects a differential value of the AC magnetic field ($-A \omega_0 nI_0 \omega \cos \omega t$), the fine-detection coil 224 may be referred to as a Ḃ coil. The coefficient A indicates a cross section of the fine-detection coil 224. A lock-in amplifier 235 for a fine-detection coil may be further provided as a phase-sensitive detector which detects a signal of the fine-detection coil 224, since the AC magnetic field ($B_{ac}$) produced from the AC drive coil 222a is less uniform than that produced from the Helmholtz coil 122 shown in FIG. 1. The lock-in amplifier 235 for a fine-detection coil compares frequencies of an AC magnetic field detected by the fine-detection coil 224 to provide a uniform AC magnetic field having a frequency of ω applied to a magnetoelectric sample. Accordingly, the uniform AC magnetic field can be applied to the magnetoelectric sample.

The electrical shield 250 electrically shields the magnetoelectric sample and the fine-detection coil 224 from the AC drive coil 222a. The electrical shield 250 may be configured to encompass a sample area 210s for placing the magnetoelectric sample, and the fine-detection coil 224 located below the sample area 210s. The electrical shield 250 is preferably made of stainless steel, aluminum, copper, or Oxygen-Free High Conductivity (OFHC) Copper. The copper and the oxygen-free high conductivity copper may be plated with gold to be prevented from oxidation. The electrical shield 250 is preferably made of stainless steel in order to minimize electrical noise occurring during low-temperature measurement, thereby acquiring excellent measurement sensitivity during room temperature measurement.

The charge amplifier 240 amplifies a charge signal δQ of a magnetoelectric sample oscillating by the AC magnetic field ($B_{ac}$) having a frequency of ω produced from the AC drive coil 222a and converts the amplified charge signal to a voltage signal δV. The charge amplifier 240 may include a resistor, a capacitor and an operational amplifier (OP amp), which are connected in parallel. In one embodiment, the resistor may have a resistance of about 1 GΩ. The capacitor may have a capacitance of about 1 pF. The magnetoelectric sample and the charge amplifier 240 may be connected to each other through a micro-coaxial cable in order to increase measurement sensitivity by minimizing signal reduction when measuring electric charges of the magnetoelectric sample.

The lock-in amplifier 230 is used as a phase sensitive detector and detects the voltage signal δV from the charge amplifier 240. Accordingly, it is possible to measure the charge signal δQ of the magnetoelectric sample oscillating by the AC magnetic field $B_{ac}$ having a frequency of ω produced from the AC drive coil 222a by the induced current ($I_0 \sin \omega t$) having a frequency of ω supplied from the lock-in amplifier 230.

As a result, unlike a conventional system for measuring voltage which is produced by a variation in an electric dipole generated on the magnetoelectric sample, the magnetoelectric susceptibility measurement system according to an exemplary embodiment of the present invention uses the charge amplifier to amplify electric charges of the magnetoelectric sample oscillating by the AC magnetic field, thereby substantially improving measurement sensitivity of magnetoelectric effect. Furthermore, since the magnetoelectric susceptibility measurement system is manufactured to be compatible with a Physical Property Measurement System (PPMS) that is widely used in research on material property characterization, the system has excellent measurement sensitivity of magnetoelectric effect under cryogenic conditions at temperatures and a high magnetic field.

Figure 6:
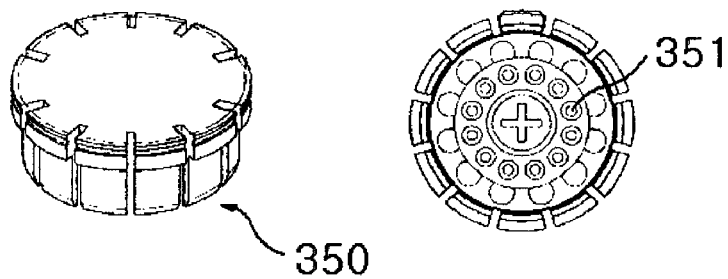
FIG. 6 illustrates an example of a transport puck for PPMS manufactured by Quantum Design Co., Ltd.
Figure 7:
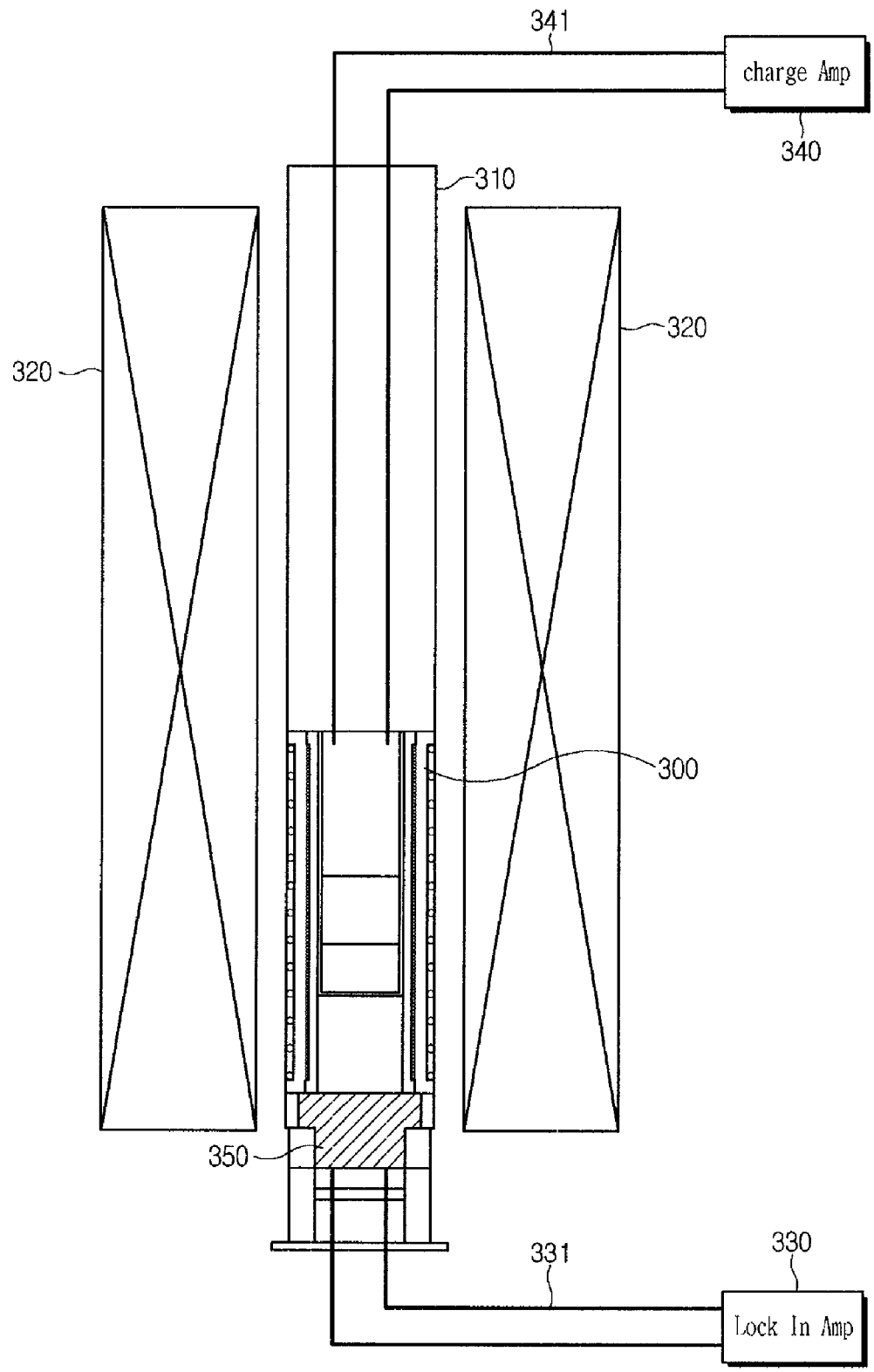
FIG. 7 illustrates an AC solenoid coil set that is compatible with the PPMS.

The magnetoelectric susceptibility measurement system may be operatively connected to a PPMS manufactured by Quantum Design. FIG. 6 is a cross-sectional view of a transport puck 350 of the PPMS and a lower portion thereof, which may be connected to an AC solenoid coil set 300 according to an exemplary embodiment of the present invention. FIG. 7 illustrates the AC solenoid coil set 300 which is mounted on the magnetoelectric susceptibility measurement system. The PPMS has a chamber 310 with an inside diameter of about 26.5 mm, in the chamber being submerged in liquid helium which is adjusted to a temperature of down to 1.8K and a superconducting magnet 320 is provided around the chamber 310 to produce a desired magnetic field. The system is configured to employ a personal computer for instructing desired temperature and magnetic field to the PPMS through a GPIB interface, where the magnetic field supplied from the PPMS is used as DC magnetic bias in the magnetoelectric susceptibility measurement system.

The system is configured in such a manner that a coil set for applying an AC magnetic field is placed in a chamber and a sample is positioned in the middle of the coil. AC current is supplied to the coil using two of twelve pins 351 at bottom of the PPMS chamber to apply the AC magnetic field. Preferably, a branch coil 331 of the AC drive coil is connected to the lock-in amplifier 330 through pins of a transport puck at a lower side of a PPMS chamber. In addition, a signal generated by the polarization of the sample is preferably connected through the micro-coaxial cable to the charge amplifier 340 through an upper side of the PPMS chamber. Therefore, it is possible to perform a more sensitive measurement when measuring the magnetoelectric effect of a sample under cryogenic conditions. In order to conveniently mount the AC solenoid coil set, a cylindrical transport stick (not shown) is additionally provided to mount the coil set, to mount a sample at center thereof, to allow a coaxial cable to pass therethough, and to be connected to a transport puck.

As apparent from the above description, according to the exemplary embodiments of the present invention, the magnetoelectric susceptibility measurement system including a charge amplifier can measure magnetoelectric effect of magnetoelectric materials with high measurement sensitivity. Accordingly, it is possible to provide a magnetoelectric susceptibility measurement system with improved measurement sensitivity.

In addition, according to the exemplary embodiments of the present invention, the magnetoelectric susceptibility measurement system including a charge amplifier can measure magnetoelectric effect of magnetoelectric materials both at low-frequency and high-frequency bands. Accordingly, it is possible to provide a magnetoelectric susceptibility measurement system which can be used in a wide frequency range.

Furthermore, according to the exemplary embodiments of the present invention, the magnetoelectric susceptibility measurement system including a charge amplifier can measure magnetoelectric effect of magnetoelectric materials in cryogenic (1.8K) and high-intensity magnetic field environments. Accordingly, it is possible to provide a magnetoelectric susceptibility measurement system which allows research into properties of new materials exhibiting the magnetoelectric effect.

The invention claimed is:

1. A system for measuring magnetoelectric susceptibility, comprising:
a device configured to supply a DC magnetic bias to the magnetoelectric sample;
an upper electrode formed on the magnetoelectric sample;
a lower electrode formed under the magnetoelectric sample;
a Helmholtz coil configured to apply an AC magnetic field to the magnetoelectric sample;
a charge amplifier configured to amplify an electric charge signal of the magnetoelectric sample oscillating by the AC magnetic field; and
a phase sensitive detector configured to detect the electric charge signal amplified by the charge amplifier, and to supply induced current to the Helmholtz coil.

2. The system according to claim 1, wherein the charge amplifier comprises a resistor, a capacitor, and an operational amplifier, which are connected in parallel.

3. The system according to claim 2, wherein the resistor has a resistance in the range of 100Ω (ohm) to 1 GΩ (gigaohm).

4. The system according to claim 2, wherein the capacitor has a capacitance in the range of 1 µF to 1 pF.

5. The system according to claim 2, wherein the resistor has a resistance in the range of 100Ω to 1 GΩ and the capacitor has a capacitance in the range of 1 µF to 1 pF.

6. The system according to claim 1, wherein the device configured to supply the DC magnetic bias comprises one of an electromagnet and a superconducting magnet.

7. A system for measuring magnetoelectric susceptibility, comprising:
a device configured to supply a DC magnetic bias to the magnetoelectric sample;
an upper electrode formed on the magnetoelectric sample;
a lower electrode formed under the magnetoelectric sample;
a solenoidal AC drive coil configured to apply an AC magnetic field to the magnetoelectric sample;
a fine-detection coil disposed inside the AC drive coil and configured to detect oscillation of the AC magnetic field;
a charge amplifier configured to amplify an electric charge oscillation of the magnetoelectric sample oscillating by the AC magnetic field; and
a first phase sensitive detector configured to detect the electric charge signal amplified by the charge amplifier while supplying a drive current to the AC drive coil.

8. The system according to claim 7, wherein the device configured to supply the DC magnetic bias comprises a superconducting magnet.

9. The system according to claim 7, further comprising:
an electrical shield configured to electrically shield the magnetoelectric sample and the fine-detection coil from the AC drive coil.

10. The system according to claim 9, wherein the electrical shield comprises a material selected from the group of stainless steel, aluminum, copper, and oxygen-free high conductivity copper.

11. The system according to claim 7, further comprising:
an AC compensation coil configured to compensate an outside component of the AC magnetic field of the AC drive coil.

12. The system according to claim 11, wherein the AC compensation coil is a solenoid coil.

13. The system according to claim 12, wherein the AC compensation coil is wound in a direction opposite to a direction of the AC drive coil.

14. The system according to claim 13, wherein the AC compensation coil is electrically connected directly to the AC drive coil.

15. The system according to claim 7, further comprising:
a second phase sensitive detector configured to detect a signal of the fine-detection coil.

16. The system according to claim 7, wherein the magnetoelectric sample and the charge amplifier are connected to each other by a micro coaxial cable.

17. The system according to claim 16, wherein the device supplying the DC magnetic bias is a physical property measurement system (PPMS, manufactured by Quantum Design Co., Ltd.) comprising a superconducting magnet and a cryostat.

18. The system according to claim 17, wherein a branch coil of the AC drive coil is connected through a transport puck at a lower side of a PPMS chamber, and the micro coaxial cable is connected to the charge amplifier through an upper side of the PPMS chamber.

19. The system according to claim 7, wherein the device supplying the DC magnetic bias further comprises a cryostat.

* * * * *